(12) United States Patent
Kondo et al.

(10) Patent No.: US 10,128,881 B2
(45) Date of Patent: Nov. 13, 2018

(54) TIME TO DIGITAL CONVERTER, RADIO COMMUNICATION DEVICE, AND RADIO COMMUNICATION METHOD

(71) Applicant: KABUSHIKI KAISHA TOSHIBA, Minato-ku (JP)

(72) Inventors: Satoshi Kondo, Kawasaki (JP); Akihide Sai, Yokohama (JP); Tuan Thanh Ta, Kawasaki (JP); Hidenori Okuni, Yokohama (JP); Masanori Furuta, Odawara (JP); Tetsuro Itakura, Nerima (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 60 days.

(21) Appl. No.: 15/462,232

(22) Filed: Mar. 17, 2017

(65) Prior Publication Data

US 2017/0373709 A1 Dec. 28, 2017

(30) Foreign Application Priority Data

Jun. 24, 2016 (JP) ................................. 2016-125759

(51) Int. Cl.
*G04F 10/00* (2006.01)
*H03L 7/089* (2006.01)
(Continued)

(52) U.S. Cl.
CPC ............. *H04B 1/16* (2013.01); *G04F 10/005* (2013.01); *H03G 3/3042* (2013.01);
(Continued)

(58) Field of Classification Search
CPC ....... G04F 10/005; H03L 7/093; H03L 7/099; H03L 7/0891; H03L 7/091; H03L 7/095; H03L 7/0991; H04L 7/033
See application file for complete search history.

(56) References Cited

U.S. PATENT DOCUMENTS 6,429,693 B1 8/2002 Staszewski et al.
9,804,573 B1 * 10/2017 Drost ................... G04F 10/005
(Continued)

FOREIGN PATENT DOCUMENTS

JP    2002-76886      3/2002
JP    2006-181735     7/2006
WO   WO 2016/104464 A1  6/2016

OTHER PUBLICATIONS

Robert Bogdan Staszewski et al., "ALL-Digital PLL and Transmitter for Mobile Phones", IEEE Journal of Solid-State Circuits vol. 40, No. 12, Dec. 2005, pp. 7.

*Primary Examiner* — David B. Lugo
(74) *Attorney, Agent, or Firm* — Oblon, McClelland, Maier & Neustadt, L.L.P.

(57) ABSTRACT

A time to digital converter has a counter, a first phase difference detector, a first capacitor, a second capacitor having capacitance N times a capacitance of the first capacitor, a comparator to compare a charge voltage of the first capacitor with a charge voltage of the second capacitor, a first charge controller, a first phase difference arithmetic unit, a second phase difference detector, a second charge controller, a second phase difference arithmetic unit to operate the phase difference between the first signal and the second signal, and a third phase difference arithmetic unit to detect a fractional phase difference between the first signal and the second signal. The first phase difference arithmetic unit operates the phase difference between the first signal and the second signal, based on a reference phase, when the counter suspends a measurement operation.

20 Claims, 12 Drawing Sheets

(51) Int. Cl.
    *H03L 7/091*    (2006.01)
    *H03L 7/095*    (2006.01)
    *H03L 7/099*    (2006.01)
    *H04B 1/16*     (2006.01)
    *H03G 3/30*     (2006.01)

(52) U.S. Cl.
    CPC ............ *H03L 7/0891* (2013.01); *H03L 7/091* (2013.01); *H03L 7/095* (2013.01); *H03L 7/0991* (2013.01); *H03G 3/3052* (2013.01); *H03L 2207/50* (2013.01)

(56) References Cited

U.S. PATENT DOCUMENTS

| | | | |
|---|---|---|---|
| 9,811,056 B2 * | 11/2017 | Cho | G04F 10/005 |
| 2015/0145572 A1 * | 5/2015 | Sato | G04F 10/005 |
| | | | 327/159 |
| 2017/0194972 A1 | 7/2017 | Sai et al. | |

* cited by examiner

US 10,128,881 B2

TIME TO DIGITAL CONVERTER, RADIO COMMUNICATION DEVICE, AND RADIO COMMUNICATION METHOD

CROSS REFERENCE TO RELATED APPLICATIONS

This application is based upon and claims the benefit of priority from the prior Japanese Patent Application No. 2016-125759, filed on Jun. 24, 2016, the entire contents of which are incorporated herein by reference.

FIELD

Embodiments of the present disclosure relate to a time to digital converter, a radio communication device, and a radio communication method.

BACKGROUND

A main circuit in a radio communication device is often formed by a CMOS process, for integration on a chip. For example, a local oscillation signal can be generated by an all-digitized all digital phase-locked loop (ADPLL) circuit and a time to digital converter.

A conventional time to digital converter latches each output of multi-staged inverters with a corresponding flip-flop to generate a phase difference signal. This type of circuit requires several-tens-staged inverters and flip-flops so that there is a problem that a circuit scale increases and additionally the consumption current of the entire time to digital converter is large.

DETAILED DESCRIPTION

Figure 1:
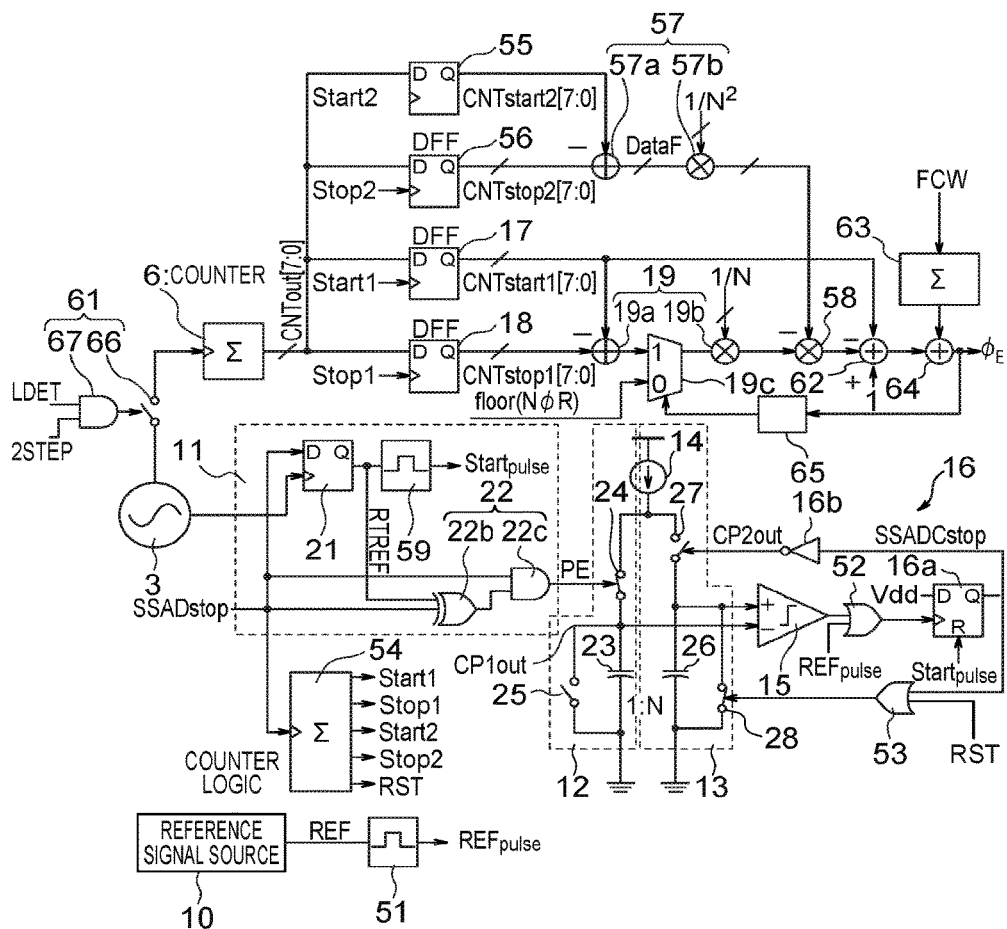
FIG. 1 is a block diagram showing a schematic configuration of a TDC according to a first embodiment.

According to one embodiment, a time to digital converter comprising:

a counter to measure the number of cycles of a first signal;

a first phase difference detector to generate a phase difference signal having a pulse width in accordance with a phase difference between the first signal and a second signal having a frequency twice or more as low as a frequency of the first signal;

a first capacitor to be charged with an electric charge in accordance with the pulse width of the phase difference signal;

a second capacitor having capacitance N times a capacitance of the first capacitor, the N being a real number larger than 1;

a comparator to compare a charge voltage of the first capacitor with a charge voltage of the second capacitor;

a first charge controller to continue to charge the second capacitor until the comparator detects that the charge voltage of the second capacitor is equal to or more than the charge voltage of the first capacitor;

a first phase difference arithmetic unit to operate the phase difference between the first signal and the second signal, based on a value obtained by dividing a count value of the counter during a charge period of the second capacitor, by the N;

a second phase difference detector to generate a phase difference signal having a pulse width in accordance with the phase difference between the first signal and the second signal when the first charge controller continues to charge the second capacitor and the comparator detects that the charge voltage of the second capacitor is equal to or more than the charge voltage of the first capacitor;

a second charge controller to continue to charge the second capacitor until the comparator again detects that the charge voltage of the second capacitor is equal to or more than the charge voltage of the first capacitor after the first capacitor is charged based on the pulse width of the phase difference signal generated by the second phase difference detector;

a second phase difference arithmetic unit to operate the phase difference between the first signal and the second signal, based on a value obtained by dividing the count value of the counter during the charge period of the second capacitor by the N squared; and a third phase difference arithmetic unit to detect a fractional phase difference between the first signal and the second signal, based on the phase difference operated by the first phase difference arithmetic unit and the phase difference operated by the second phase difference arithmetic unit, wherein the first phase difference arithmetic unit operates the phase difference between the first signal and the second signal, based on a reference phase, when the counter suspends a measurement operation.

Embodiments of the present disclosure will be described below with reference to the drawings. Distinctive configurations and operations in a time to digital converter and a radio communication device will be mainly described in the embodiments below. The time to digital converter, a phase difference pulse generator, and the radio communication device may include configurations and operations omitted in the descriptions below. Note that, the scope of the present embodiments includes the omitted configurations and operations.

First Embodiment

Figure 2:
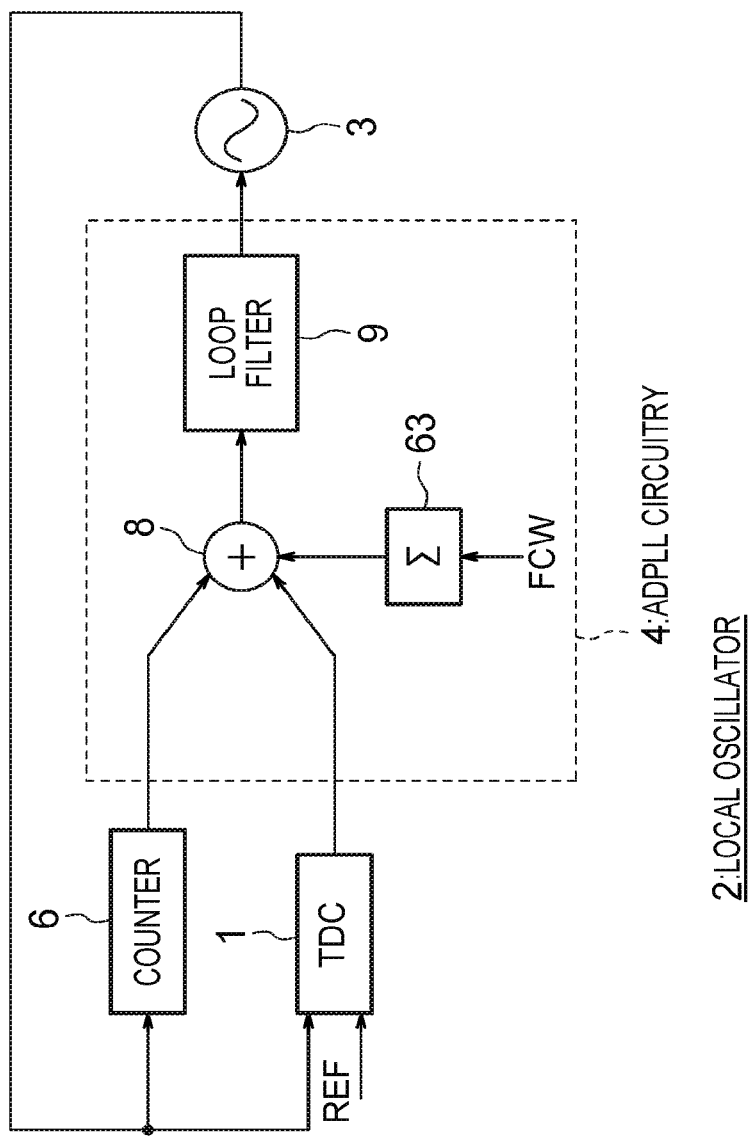
FIG. 2 is a block diagram showing a schematic configuration of a local oscillator with the TDC.

FIG. 1 is a block diagram showing a schematic configuration of a time to digital converter (TDC) 1 according to a first embodiment. FIG. 2 is a block diagram showing a schematic configuration of a local oscillator 2 with the TDC 1.

Before the descriptions of the configuration and operation of the TDC 1 in FIG. 1, the configuration and operation of the local oscillator 2 in FIG. 2 will be described.

The local oscillator 2 in FIG. 2 is circuitry that generates a local oscillation signal to be used in a radio communication device, for example. The local oscillator 2 in FIG. 2 has a digitally controlled oscillator (DCO) 3, the TDC 1 having a detailed configuration illustrated in FIG. 1, and ADPLL circuitry 4. The ADPLL circuitry 4 includes an FCW integrator 63 that integrates a frequency command word FCW to detect a reference phase φR, a logic and arithmetic unit 8 that operates phase error information based on an output signal of the TDC 1, an output signal of a counter 6 in the TDC 1 and the reference phase φR, and a loop filter 9.

In FIG. 2, the counter 6 and the FCW integrator 63 are provided separately from the TDC 1. However, an example of the counter 6 and the FCW integrator 63 provided inside the TDC 1 will be mainly described in the present specification.

The counter 6 counts the number of rising edges or falling edges of an oscillation signal of the DCO 3. The output signal of the counter 6 indicates an integer phase of the oscillation signal of the DCO 3.

The TDC 1 in detail illustrated in FIG. 1 generates a phase difference signal between the oscillation signal of the DCO 3 and a reference signal, as to be described below. The phase difference signal indicates a fractional phase of the oscillation signal of the DCO 3. The output signal of the counter 6 and the output signal of the TDC 1 are added together so that a phase of the oscillation signal of the DCO 3 can be calculated.

The logic and arithmetic unit 8 calculates a phase error signal based on the difference between the phase of the oscillation signal of the DCO 3 acquired by the addition of the output signal of the counter 6 and the output signal of the TDC 1 together and the reference phase φR detected by the FCW integrator 63.

The loop filter 9 removes a noise component included in the phase error signal. An output signal of the loop filter 9 is input to the DCO 3. The DCO 3 performs a feedback operation in order to remove the error between the frequency indicated with the frequency command word FCW and the frequency of the oscillation signal of the DCO 3, based on the output signal of the loop filter 9.

Note that, the DCO 3 is provided in the local oscillator 2 in FIG. 2. Instead of generating the oscillation signal of the DCO 3 in the local oscillator 2, an oscillation signal generated by a voltage controlled oscillator (VCO) provided outside the local oscillator 2 may be input to the local oscillator 2.

Next, the configuration and operation of the TDC 1 will be described based on FIG. 1. The TDC 1 in FIG. 1 includes the counter 6, a phase difference detector (a first phase difference detector and a second phase detector) 11, a first charge pump 12, a second charge pump 13, a first current source 14, a comparator 15, a charge and discharge controller (a first charge controller and a second charge controller) 16, a first retaining unit 17, a second retaining unit 18, a phase difference arithmetic unit (a first phase difference arithmetic unit) 19, a pulse generator 51, a counter logic unit 54, a D flip-flop (hereinafter, referred to as a DFF) 55, a DFF 56, a second phase difference arithmetic unit 57, and a third phase difference arithmetic unit 58.

The counter 6 measures the number of cycles of the oscillation signal of the DCO 3 (a first signal). That is, the counter 6 measures the number of rising edges or falling edges of the oscillation signal of the DCO 3.

The phase difference detector 11 generates the phase difference signal PE between the oscillation signal of the DCO 3 and the reference signal (a second signal) REF. The reference signal REF is generated by, for example, a reference signal source 10. The reference signal source 10 may be provided inside or outside the TDC 1. The frequency of the reference signal REF is twice or more as low as the frequency of the oscillation signal of the DCO 3. The phase difference signal PE generated by the phase difference detector 11 indicates a phase difference in one cycle of the oscillation signal of the DCO 3, namely, a fractional phase difference.

In more detail, the phase difference detector 11 includes a DFF 21, a pulse generator 59, and a first logic and arithmetic unit 22. The phase difference detector 11 acts as the first phase difference detector and the second phase difference detector. The first phase difference detector generates a phase difference signal PE having a pulse width corresponding to the phase difference between the oscillation signal of the DCO 3 (the first signal) and a signal SSADCstop (the second signal) synchronized with the reference signal REF. The reference signal REF is a signal having a frequency twice or more lower than the frequency of the oscillation signal of the DCO 3. The second phase difference detector generates the phase difference signal (the signal PE) having a pulse width corresponding to the phase difference between the oscillation signal of the DCO 3 and the signal SSADCstop (the second signal) synchronized with the reference signal REF at a point in time when the comparator 15 detects that the charge voltage of a second capacitor 26 has been the charge voltage of a first capacitor 23 or more due to continuation of a charge to the second capacitor 26. That is, the second phase difference detector generates the phase difference signal PE having a pulse width corresponding to the phase difference between the first signal and the second signal at a point in time when the charge and discharge controller 16 continues to charge the second capacitor 26 and the comparator 15 detects that the charge voltage of the second capacitor 26 is equal to or more than the charge voltage of the first capacitor 23.

The DFF 21 generates and outputs a signal including the signal SSADCstop latched at the rising edge of the oscillation signal of the DCO 3 (hereinafter, referred to as a signal RTREF). The signal SSADCstop will be described later.

The pulse generator 59 generates and outputs a pulse signal having a predetermined width (hereinafter, referred to as a signal STARTpulse), in synchronization with the rising edge of the signal RTREF.

The first logic and arithmetic unit 22 has an EXOR gate 22b and an AND gate 22c. The EXOR gate 22b generates and outputs a signal of the exclusive disjunction between the signal RTREF and the signal SSADCstop. The AND gate 22c generates and outputs the signal PE being a conjunction between the signal SSADCstop and an output signal of the EXOR gate 22b.

The first charge pump 12 has the first capacitor 23, a first switch (a first selector) 24, and a second switch (a third selector) 25.

The first switch 24 makes a switch of whether the first capacitor 23 is charged by supplying a current from the first current source 14 to the first capacitor 23. When the first switch 24 is turned on, the current from the first current source 14 is supplied to the first capacitor 23 so that the first capacitor 23 is charged. The first switch 24 is turned on or off due to the phase difference signal PE output from the phase difference detector 11. For example, when the phase difference signal PE is high, the first switch 24 is turned on. When the phase difference signal PE is low, the first switch 24 is turned off.

The second switch 25 makes a switch of whether a short circuit is made between electrodes at both ends of the first capacitor 23. When the second switch 25 is turned on, the short circuit is made between the electrodes at both ends of the first capacitor 23 so that the first capacitor 23 is discharged. The second switch 25 is turned on or off due to an output signal of the charge and discharge controller 16 to be described later.

The second charge pump 13 has the second capacitor 26, a third switch (a second selector) 27, and a fourth switch (a fourth selector) 28.

The second capacitor 26 has capacitance N times that of the first capacitor 23 (N is a real number more than 1).

The third switch 27 makes a switch of whether the second capacitor 26 is charged by supplying the current from the first current source 14 to the second capacitor 26. When the third switch 27 is turned on, the current is supplied from the first current source 14 to the second capacitor 26 so that the second capacitor 26 is charged.

The fourth switch 28 makes a switch of whether a short circuit is made between electrodes at both ends of the second capacitor 26. When the fourth switch 28 is turned on, the short circuit is made between the electrodes at both ends of the second capacitor 26 so that the second capacitor 26 is discharged. The third switch 27 and the fourth switch 28 are turned on or off due to the output signal of the charge and discharge controller 16 to be described later.

The comparator 15 compares the charge voltage of the first capacitor 23 with the charge voltage of the second capacitor 26 to output a signal corresponding to the voltage difference between both of the charge voltages.

An OR gate 52 generates a signal of the disjunction between the output signal of the comparator 15 and a signal REFpulse. A DFF 16a latches a power source voltage Vdd at the rising edge of the OR gate 52 to generate the signal SSADCstop. The DFF 16a resets the signal SSADCstop when the signal STARTpulse is turned high. The OR gate 53 generates and outputs a signal of the disjunction between the signal SSADCstop and a signal RST. When the output signal of the OR gate 53 is turned high, the fourth switch 28 is turned on so that the second capacitor 26 is discharged. The signal RST outputs a positive pulse at every third rising edge of the signal SSADCstop.

The charge and discharge controller 16 has functions of the first charge controller and the second charge controller. The first charge controller continues to charge the second capacitor 26 until the comparator 15 detects that the charge voltage of the second capacitor 26 is equal to or more than the charge voltage of the first capacitor 23. The second charge controller continues to charge the second capacitor 26 until the comparator 15 again detects that the charge voltage of the second capacitor 26 is equal to or more than the charge voltage of the first capacitor 23 after the first capacitor 23 is charged based on the pulse width of the phase difference signal PE detected by the second phase difference detector. The signal generated by the charge and discharge controller 16 is used for making a switch of turning the second switch 25, the third switch 27, and the fourth switch 28 on or off.

In more detail, the charge and discharge controller 16 has the DFF 16a and an inverter 16b. The output signal of the comparator 15 is input to a clock terminal of the DFF 16a, a D input terminal of the DFF 16a is set to the power source voltage Vdd, and a signal START is input to a reset terminal of the DFF 16a. The signal START is a pulse signal having a pulse width corresponding to a period during which the output signal of the DFF 21 in the phase difference detector 11 is high. When the signal START is input, the DFF 16a is reset so that the charge of the second capacitor 26 starts. A Q output signal of the DFF 16a is a signal STOP. While the signal STOP is low, the third switch 27 is on and the fourth switch 28 is off so that the second capacitor 26 is charged. When the signal STOP is turned high, the third switch 27 is off and the fourth switch 28 is on so that the second capacitor 26 is discharged. When the comparator 15 detects that the charge voltage of the second capacitor 26 is equal to or more than the charge voltage of the first capacitor 23, the signal STOP is turned high. In this manner, when the charge voltage of the second capacitor 26 is equal to or more than the charge voltage of the first capacitor 23, the charge of the second capacitor 26 is completed and additionally the first capacitor 23 and the second capacitor 26 are discharged.

The counter logic unit 54 generates various control signals START1, STOP1, START2, STOP2, and RST, based on a signal SSADstop synchronized with the reference signal REF. According to the present embodiment, an approximate fractional phase difference is detected at a first stage and a highly precise fractional phase difference is detected at a second stage. The signal START1 and the signal STOP1 are signals for notification of the start and the completion of the charge of the second capacitor 26 at the first stage, respectively. The signal START2 and the signal STOP2 are signals for notification of the start and the completion of the charge of the second capacitor 26 at the second stage, respectively. The signal RST is a reset signal after the second stage is completed.

The first retaining unit 17 retains the count value of the counter 6 at a point in time when the charge of the second capacitor 26 starts. The first retaining unit 17 has, for example, a DFF 17. The count value of the counter 6 is input to a D input terminal of the DFF 17, and the signal START1 is input to a clock terminal.

The DFF 17 latches (retains) the count value of the counter 6 at the rising edge of the signal START1.

The second retaining unit 18 retains the count value of the counter 6 at a point in time when the comparator 15 detects that the charge voltage of the second capacitor 26 is equal to or more than the charge voltage of the first capacitor 23. The second retaining unit 18 has, for example, a DFF 18. The count value of the counter 6 is input to a D input terminal of the DFF 18, and the signal STOP1 is input to a clock terminal.

The phase difference arithmetic unit 19 operates the phase difference between the oscillation signal of the DCO 3 and the reference signal REF. In more detail, the phase difference arithmetic unit 19 operates a fractional phase difference smaller than the one cycle of the oscillation signal of the DCO 3.

The phase difference arithmetic unit (the first phase difference arithmetic unit) 19 operates the phase difference between the oscillation signal of the DCO3 (the first signal) and the reference signal (the second signal) REF, based on the reference phase φR in a case where the counter 6 has suspended a measurement operation. The phase difference arithmetic unit 19 has, for example, a difference arithmetic unit 19a that operates the difference between a value retained by the first retaining unit 17 and a value retained by the second retaining unit 18, a multiplexer 19c coupled to the output side of the difference arithmetic unit 19a, and a multiplier 19b coupled to the output side of the multiplexer 19c. The multiplexer 19c selects any one of an integral component of a value including the reference phase φR multiplied by N and the difference operated by the difference arithmetic unit 19a, based on a lock detection signal of a lock detector 65 to be described later. In more detail, the multiplexer 19c selects NφR when the lock detector 65 detects a lock, and selects the difference operated by the difference arithmetic unit 19a when the lock is not detected. The multiplier 19b outputs a value including a selection value of the multiplexer 19c multiplied by 1/N.

The DFF 55 latches the count value of the counter 6 at the rising edge of the signal START2. The DFF 56 latches the count value of the counter 6 at the rising edge of the signal STOP2.

A difference arithmetic unit 57a in the second phase difference arithmetic unit 57 operates the difference value between the count value retained by the DFF 56 and the count value retained by the DFF 55. A multiplier 57b operates a value including the difference value output from the difference arithmetic unit 57a, multiplied by $1/N^2$.

The third phase difference arithmetic unit 58 operates and outputs the difference between the value output from the multiplier 19b and the value output from the multiplier 57b. The output signal of the third phase difference arithmetic unit 58 is a signal PhaseError indicating a fractional phase difference.

In addition, the TDC 1 in FIG. 1 includes a counter switching controller 61, a phase detector 62, the FCW integrator 63, a phase error detector 64, and the lock detector 65.

The counter switching controller 61 has a switch 66 and an arithmetic unit 67. The switch 66 makes a switch of whether the oscillation signal of the DCO 3 is supplied to a clock terminal of the counter 6, based on an output signal of the arithmetic unit 67. The arithmetic unit 67 generates a signal to be turned high at the second stage at which the lock detector 65 detects the lock and additionally the second charge controller starts the charge to the first capacitor 23. The switch 66 supplies the oscillation signal of the DCO 3 to the counter 6 when the output signal of the arithmetic unit 67 is turned high, so that the counter 6 starts the measurement operation.

In this manner, the counter 6 according to the present embodiment performs the measurement operation when the lock detector 65 detects the lock and additionally the second stage is provided. Therefore, the counter 6 suspends the measurement operation during a period during which the first charge controller charges the first capacitor 23 or the second capacitor 26. Accordingly, a reduction of power consumption is achieved.

The phase detector 62 detects the phase of the oscillation signal of the DCO 3 (the first signal), based on the count value of the counter 6 and the fractional phase difference detected by the third phase difference arithmetic unit 58. The FCW integrator 63 integrates the frequency command word FCW to detect the reference phase φR. The phase error detector 64 detects a phase error φE, based on the phase of the first signal detected by the phase detector 62 and the reference phase φR.

The lock detector 65 detects that the phase error φE has been a predetermined threshold value or less. The ADPLL circuitry 4 illustrated in FIG. 2 performs PLL control to the TDC 1 according to the present embodiment, and a state where the oscillation frequency of the oscillation signal of the DCO 3 has been controlled to be a desired value, is referred to as a lock state. When the phase of the DCO 3 is a predetermined threshold value or less, the lock detector 65 determines that the oscillation signal of the DCO 3 has been locked, so that a signal LDET is turned to be at a high level.

As described above, the switch 66 in the counter switching controller 61 supplies the oscillation signal of the DCO 3 to the counter 6 when the oscillation signal of the DCO 3 has been locked at the second stage. Accordingly, the counter 6 starts the measurement operation.

Figure 3:
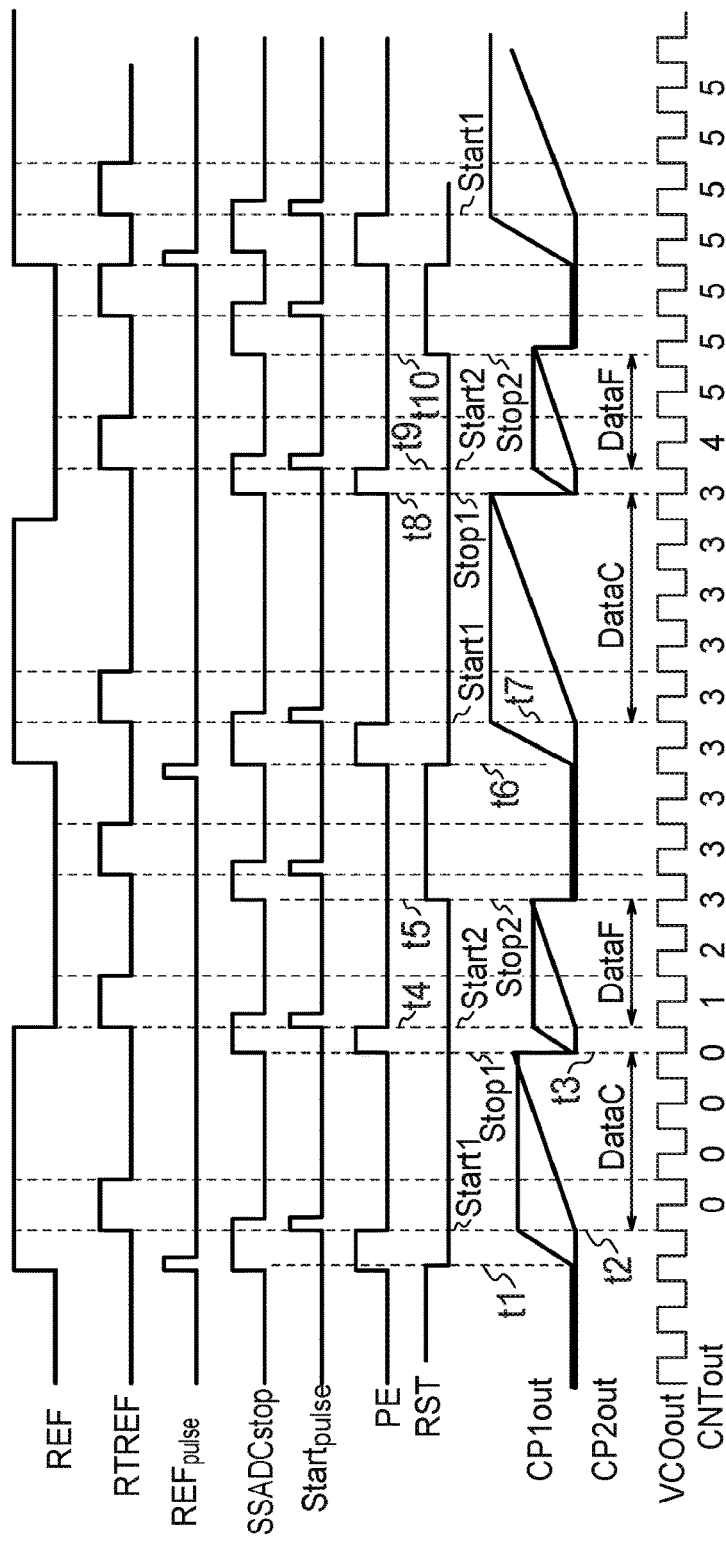
FIG. 3 is a timing chart of the TDC according to the first embodiment.

FIG. 3 is a timing chart of the TDC 1 according to the first embodiment. The operation of the TDC 1 in FIG. 1 will be described with reference to the timing chart.

The signal PE indicating the phase difference between the reference signal REF and the oscillation signal of the DCO 3 is turned high between time t1 and time t2 so that the first capacitor 23 is charged during the period. After that, the second capacitor 26 is charged between time t2 and time t3. At time t3, the charge voltage of the first capacitor 23 and the charge voltage of the second capacitor 26 correspond to each other so that the output of the comparator 15 is inverted and the signal SSADCstop is turned high.

According to the present embodiment, the ratio N of the capacitance of the second capacitor 26 to the capacitance of the first capacitor 23 is considerably small and, for example, the following expression is satisfied: N=4. Therefore, the output of the comparator 15 is inverted in a relatively short time. Accordingly, the signal PE is turned high again between time t3 and time t4 so that the first capacitor 23 is charged again during the period. The second capacitor 26 is charged between time t4 and time t5. At time t5, the charge voltage of the first capacitor 23 and the charge voltage of the second capacitor 26 correspond to each other again so that the output of the comparator 15 is inverted again. In this case, the signal RST is turned high and the signal PE remains low.

Between time t1 and time t3, the switch 66 is off and the oscillation signal of the DCO 3 is not supplied to the counter 6 so that the counter 6 suspends the measurement operation. Therefore, the power consumption can be reduced between time t1 and time t3.

While the counter 6 suspends the measurement operation, the output of the first retaining unit 17 and the output of the second retaining unit 18 are zero, and the output of the difference arithmetic unit 19a is also zero. In this case, when the lock detector 65 detects no lock, the output of the multiplexer 19c is zero.

When the lock detector 65 detects the lock, the multiplexer 19c outputs the integral component of the value including the reference phase φR multiplied by N. As illustrated in FIG. 2, the ADPLL circuitry 4 performs the PLL control to the TDC1 so that an output value of the TDC 1 is predicted to be close to a predictive value even when the counter 6 performs no measurement operation. Therefore, according to the present embodiment, the counter 6 performs the measurement operation only when the fractional phase is detected.

When the lock detector 65 detects the lock even without the counter 6 performing the measurement operation, the multiplexer 19c outputs the integral component of the value including the reference phase φR multiplied by N. Then, the multiplier 19b multiplies the output value by 1/N so that the approximate fractional phase difference can be calculated.

The first stage includes a period between time t1 and time t3, and the second stage includes a period between time t3 and time t5. When the lock detector 65 detects the lock at the second stage, the switch 66 is turned on and the oscillation signal of the DCO 3 is supplied to the clock terminal of the counter 6 so that the counter 6 starts the measurement operation. The measurement value of the counter 6 is counted up from 0 to 3 between time t4 and time t5 in the example of FIG. 3.

The signal PE between time t3 and time t4 is the phase difference in an amount that has not been detected between time t1 and time t3. The phase difference in the amount is detected between time t4 and time t5. The phase difference detected between time t4 and time t5 is output from the difference arithmetic unit 57a in the second phase difference arithmetic unit 57. The multiplier 57b multiplies the phase difference by $1/N^2$ so that a final fractional phase difference is detected by the third phase difference arithmetic unit 58.

The phase detector 62 detects the phase φdco of the DCO 3 based on Expression (1) below with the fractional phase difference detected by the third phase difference arithmetic unit 58 and an integer phase difference being the value retained by the first retaining unit 17.

$$\varphi dco = \varphi I - \varphi F + 1 \qquad (1)$$

The phase error detector 64 detects the phase error φE being the difference between a value including the reference phase φR converted from the frequency command word FCW by the FCW integrator 63 and the phase φdco of the DCO 3. The phase error φE is input to the lock detector 65 so as to be used to detect the lock.

In this manner, according to the present embodiment, the processing of detecting the fractional phase difference is performed by being separated into two stages. The approximate fractional phase difference is detected at the first stage and the fractional phase difference in the amount that has not been detected at the first stage, is detected at the second stage. The phase difference is detected with the common first capacitor 23 and second capacitor 26 at each of the first stage and the second stage so that there is no risk that a hardware configuration is complicated.

According to the present embodiment, the ratio N of the capacitance of the first capacitor 23 and the capacitance of the second capacitor 26 can be decreased so that time necessary for the first stage and the second stage, in more detail, the clock number of the oscillation signal of the DCO 3 at each of the first stage and the second stage can be reduced. As a result, the fractional phase difference having higher precision can be detected in a shorter time. For example, when a 16-staged fractional phase difference is detected, according to the first embodiment, the following expression is required to be satisfied: N=16. The capacitance of the second capacitor 26 is required to be large and additionally the clock number of the oscillation signal of the DCO 3 until the fractional phase difference is detected is required to be 16 at a maximum. However, according to the present embodiment, the following expression is only necessary: N=4. The capacitance of the second capacitor 26 can be reduced and additionally the clock number of the oscillation signal of the DCO 3 until the fractional phase difference is detected is only 4+4=8 clocks at a maximum. Accordingly, according to the present embodiment, the fractional phase difference can be detected with the second capacitor 26 having small capacitance with the precision remaining in a short time so that the reduction of the power consumption can be achieved.

Furthermore, according to the present embodiment, the counter 6 does not necessarily operate at the first stage. Therefore, the operation period of the counter 6 includes only the second stage so that the power consumption of the counter 6 can be reduced by half in comparison to a case where the counter 6 operates at the first stage and the second stage.

Second Embodiment

According to a second embodiment, a selection of whether a counter 6 performs a measurement operation at the first stage and the second stage described above or the counter 6 suspends the measurement operation at the first stage, can be made.

Figure 4:
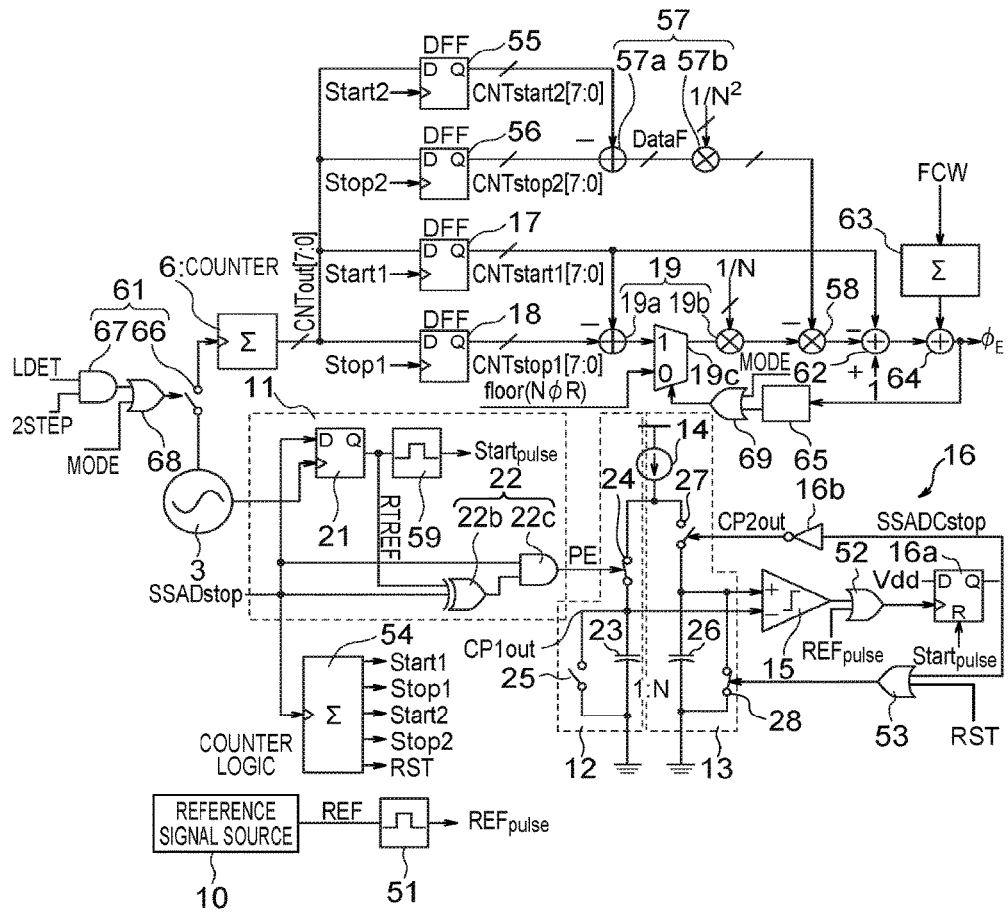
FIG. 4 is a block diagram showing an internal configuration of a TDC according to a second embodiment.

FIG. 4 is a block diagram showing an internal configuration of a TDC 1 according to the second embodiment. In FIG. 4, components in common with FIG. 1 are denoted with the same reference signs, and differences will be mainly described below. The TDC 1 in FIG. 4 includes OR gates 68 and 69 added in addition to the configuration of FIG. 1.

The OR gates 68 and 69 are included in a counter operation selector. The counter operation selector selects any one of a first operation mode in which the counter 6 performs the measurement operation while a first charge controller and a second charge controller continue to charge a second capacitor 26, and a second operation mode in which the counter 6 suspends the measurement operation while the first charge controller continues to charge the second capacitor 26 and additionally the counter 6 performs the measurement operation while the second charge controller continues to charge the second capacitor 26.

More specifically, the OR gate 68 controls a switch of whether the switch 66 is turned on or off, based on a mode selection signal MODE. More specifically, when the mode selection signal MODE is high, the output of the OR gate 68 is turned high and the switch 66 is turned on, regardless of the output logic of an arithmetic unit 67. Therefore, when the mode selection signal MODE is high, the counter 6 performs the measurement operation at both the first stage and the second stage.

When the mode selection signal MODE is high, the output of the OR gate 69 is turned high, regardless of whether a lock detector 65 has detected a lock. When the output of the OR gate 69 is turned high, a multiplexer 19c selects and outputs the output of a difference arithmetic unit 19a.

In this manner, when the mode selection signal MODE is high (the first operation mode), the counter 6 performs the measurement operation at the first stage and the second stage so that a phase error is detected. Meanwhile, when the mode selection signal MODE is low (the second operation mode), an operation similar to the first embodiment is performed. That is, in the second operation mode, the counter 6 suspends the measurement operation to detect the phase error at the first stage, and the counter 6 performs the measurement operation to detect the phase error at the second stage.

In this manner, according to the second embodiment, the mode selection signal MODE can arbitrarily make a selection of whether the counter 6 performs the measurement operation at the first stage when a fractional phase difference is detected by being separated into the first stage and the second stage.

Third Embodiment

A third embodiment relates to a phase difference pulse generator applicable as a phase difference detector 11 in a TDC 1.

Figure 5:
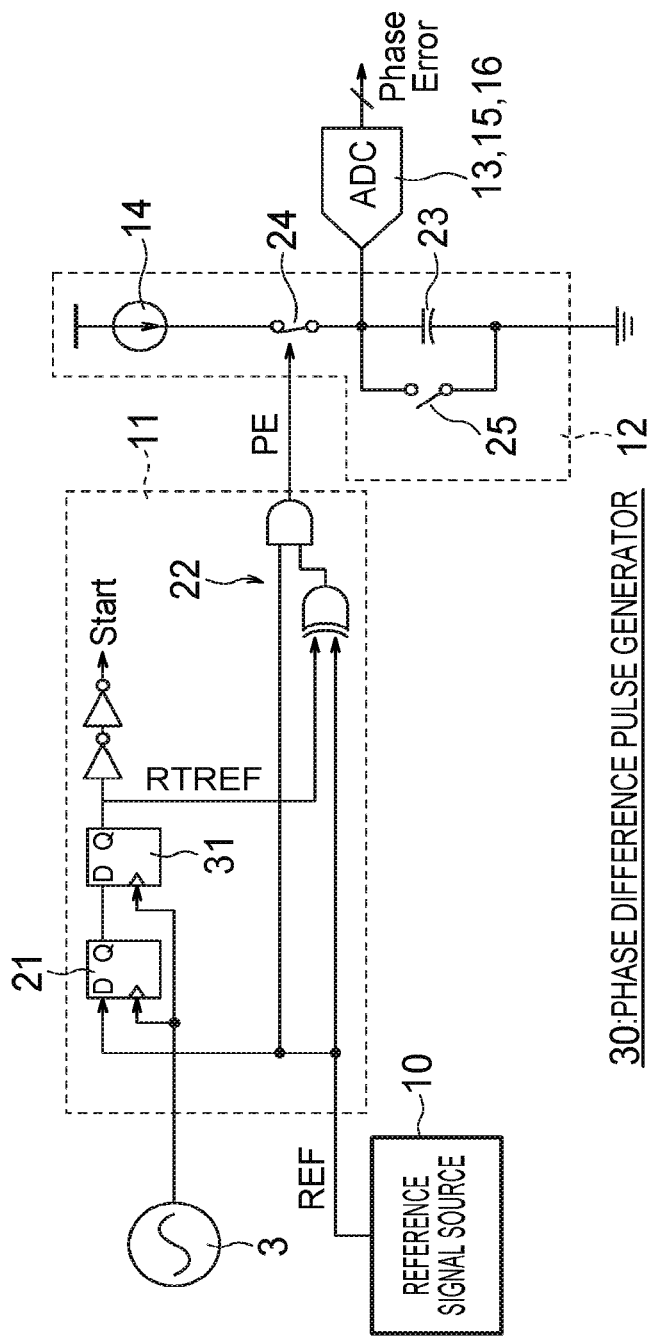
FIG. 5 is a block diagram showing an internal configuration of a phase difference pulse generator.
Figure 6:
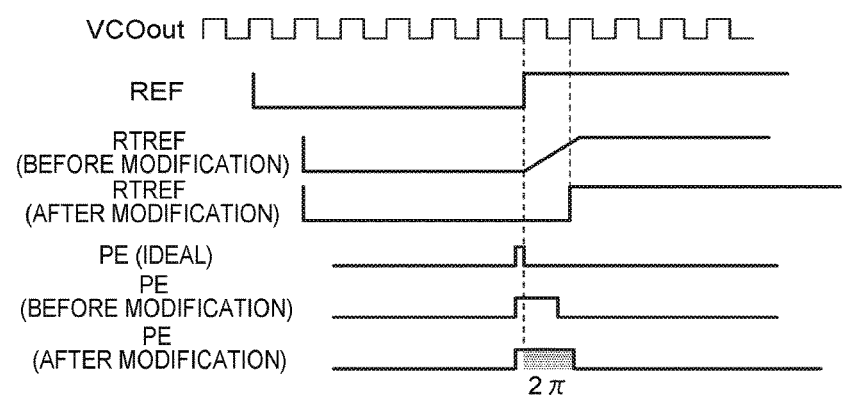
FIG. 6 is a timing chart of the phase difference pulse generator of FIG. 5.

FIG. 5 is a block diagram showing an internal configuration of the phase difference pulse generator 30. FIG. 6 is a timing chart of the phase difference pulse generator 30 of FIG. 5. The phase difference pulse generator 30 in FIG. 5 includes an m-staged DFF (second synchronizing circuitry) 31 (m is an integer of 1 or more) coupled in series to a subsequent stage of the DFF 21 in the phase difference detector 11 in FIG. 1. FIG. 5 shows an example of having a single-staged DFF 31, but an at-least-two-staged DFF 31 may be coupled in series. Note that, a reference signal REF is input to the phase difference detector 11 in FIG. 5 instead of the signal SSADstop signal of FIG. 1, but a signal SSADstop signal may be input.

The phase difference detector 11 in FIG. 1 inputs the Q output signal RTREF of the DFF 21 to the first logic and arithmetic unit 22, whereas a Q output signal of a DFF at a last stage in the nn-staged DFF 31 is defined as a signal RTREF so that the signal RTREF is input to a first logic and arithmetic unit 22 in FIG. 5.

The first logic and arithmetic unit 22 generates a phase difference signal (a signal PE) having a pulse width corresponding to the phase difference between an oscillation signal of a DCO 3 and a reference signal REF at a point in time when a comparator 15 detects that the charge voltage of a second capacitor 26 is equal to or more than the charge voltage of a first capacitor 23, similarly to FIG. 1. The phase difference signal PE is used for making a switch of whether a first switch 24 is turned on or off in a first charge pump 12, similarly to FIG. 1.

The reason why the m-staged DFF 31 is coupled in series to the subsequent stage of the DFF 21 that synchronizes the reference signal REF with the oscillation signal of the DCO 3 is that the reference signal REF and the oscillation signal of the DCO 3 are in asynchronization and the DFF 21 possibly performs a retaining operation without satisfying determined setup time and hold time when the DFF 21 performs the latch operation so that there is a risk that a Q output signal of the DFF 21 becomes a metastable state. Accordingly, in circuitry of FIG. 5, the m-staged DFF 31 is coupled in series to the subsequent stage of the DFF 21 and the latch operation is repeated with a clock signal having timing the same as that of the DFF 21 (in this case, the oscillation signal of the DCO 3) so that the waveform of the Q output signal of the DFF 31 is inhibited from being distorted. For example, when the following expression is satisfied: m=1, the DFFs 21 and 31 totally including two stages, are coupled in series. When the Q output signal of the DFF 31 being at a second stage is still in a metastable state, another DFF 31 is further added so that the metastable state further barely occurs. Note that, as illustrated in FIG. 6, every time the value of m increases by one, the pulse width of the phase difference signal PE increases by 2n, namely, by one cycle of the oscillation signal of the DCO 3. However, even when the pulse width of the phase difference signal PE increases, no problem occurs in particular in terms of detection of a phase error.

In this manner, according to the third embodiment, even when the Q output signal of the DFF 21 that synchronizes the reference signal REF at the rising edge or falling edge of the oscillation signal of the DCO 3, becomes in the metastable state, the m-staged DFF 31 is coupled in series to the subsequent stage of the DFF 21 so that the waveform of the Q output signal of the DFF at the last stage can be made steep. Therefore, even when the oscillation signal of the DCO 3 and the reference signal REF are in asynchronization, it is possible to accurately generate the phase difference signal PE in accordance with the phase difference between the reference signal REF and the oscillation signal of the DCO 3.

Fourth Embodiment

According to a fourth embodiment to be described below, the phase difference pulse generator 30 described in the third embodiment is used as a phase difference detector 11 in a TDC 1.

Figure 7:
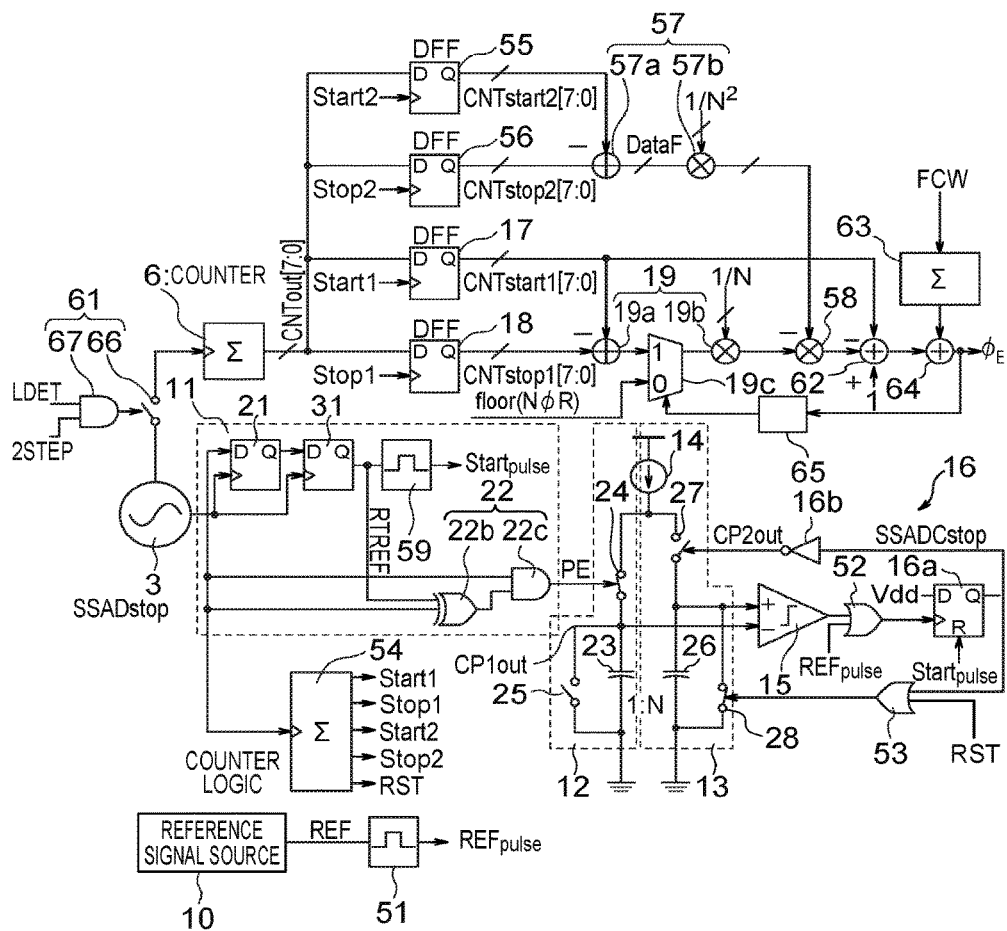
FIG. 7 is a block diagram showing an internal configuration of a TDC according to a fourth embodiment.

FIG. 7 is a block diagram showing an internal configuration of the TDC 1 according to the fourth embodiment. The TDC 1 in FIG. 7 includes the phase difference pulse generator 30 of FIG. 5 replaced with the phase difference detector 11 in the TDC 1 of FIG. 1. A phase difference signal PE generated by a phase difference detector 11 in FIG. 7 has a pulse width corresponding to the number of stages in an m-staged DFF 31. Providing the m-staged DFF 31 prevents a Q output signal RTREF of a DFF at a last stage in the m-staged DFF 31 from being in a metastable state even when a signal SSADstop synchronized with a reference signal REF and an oscillation signal of a DCO 3 are in asynchronization, so that the waveform of the phase difference signal PE can be made to have a steep pulse signal.

Every time the number of stages in the DFF 31 increases by one stage, the pulse width of the phase difference signal PE increases by 2n, namely, by one cycle of the oscillation signal of the DCO 3. Accordingly, the charge time of a first capacitor 23 in a first charge pump 12 also corresponds to the number of stages in the m-staged DFF 31. The charge time of a second capacitor 26 in a second charge pump 13 also corresponds to the number of stages in the m-staged DFF 31. The count value of the counter 6 also increases in response to the number of stages in the m-staged DFF 31. A difference count value operated by a difference arithmetic unit 19a is a value including the count value in an amount of the m-staged DFF 31 added to the count value in an amount of an original phase difference. A single-staged DFF 31 corresponds to the one cycle of the oscillation signal of the DCO 3. Therefore, when the m-staged DFF 31 is coupled in series, the difference arithmetic unit 19a outputs the value obtained by adding count values for m cycles.

In this manner, when the m-staged DFF 31 is coupled in series in the phase difference detector 11, a phase difference output from the TDC 1 includes the oscillation cycle of the DCO 3 multiplied by m/N, added to an original fractional phase difference.

Even when the output of the TDC 1 includes the oscillation cycle of the DCO 3 multiplied by m/N, ADPLL circuitry 4 can perform phase locked processing. Therefore, even when the TDC 1 outputs the fractional phase difference added with the value for the m-staged DFF 31, nothing specifically interferes in performing the phase locked control of the ADPLL circuitry 4.

In this manner, according to the fourth embodiment, the m-staged DFF 31 is coupled in series to a subsequent stage of a DFF 21 that synchronizes the reference signal REF at the rising edge or falling edge of the oscillation signal of the DCO 3, in the phase difference detector 11. Thus, the Q output signal of the DFF at the last stage in the m-staged DFF 31 is prevented from being in the metastable state so that the pulse of the phase difference signal PE has a steep waveform. Therefore, the phase difference between the oscillation signal of the DCO 3 and the reference signal REF can be accurately detected.

Fifth Embodiment

According to a fifth embodiment to be described below, a charge pump operation in a second charge pump 13 is accelerated.

According to the fourth embodiment, the m-staged DFF 31 is provided in the phase difference detector 11 so that the pulse width of the phase difference signal PE increases in the amount of the m-staged DFF 31. Every time m increases by one, the pulse width of the phase difference signal PE increases by the one cycle of the oscillation signal of the DCO 3. Every time m increases, the charge voltage CP1out of the first capacitor 23 increases. As a result, time necessary for causing the charge voltage CP2out of the second capacitor 26 to be equivalent to the charge voltage CP1out of the first capacitor 23, lengthens so that it takes time to detect the phase difference.

This means that the dynamic range of a single-slope A/D converter, namely, the dynamic range of the TDC 1 decreases. A measure against the problem is provided to the fifth embodiment.

Figure 8:
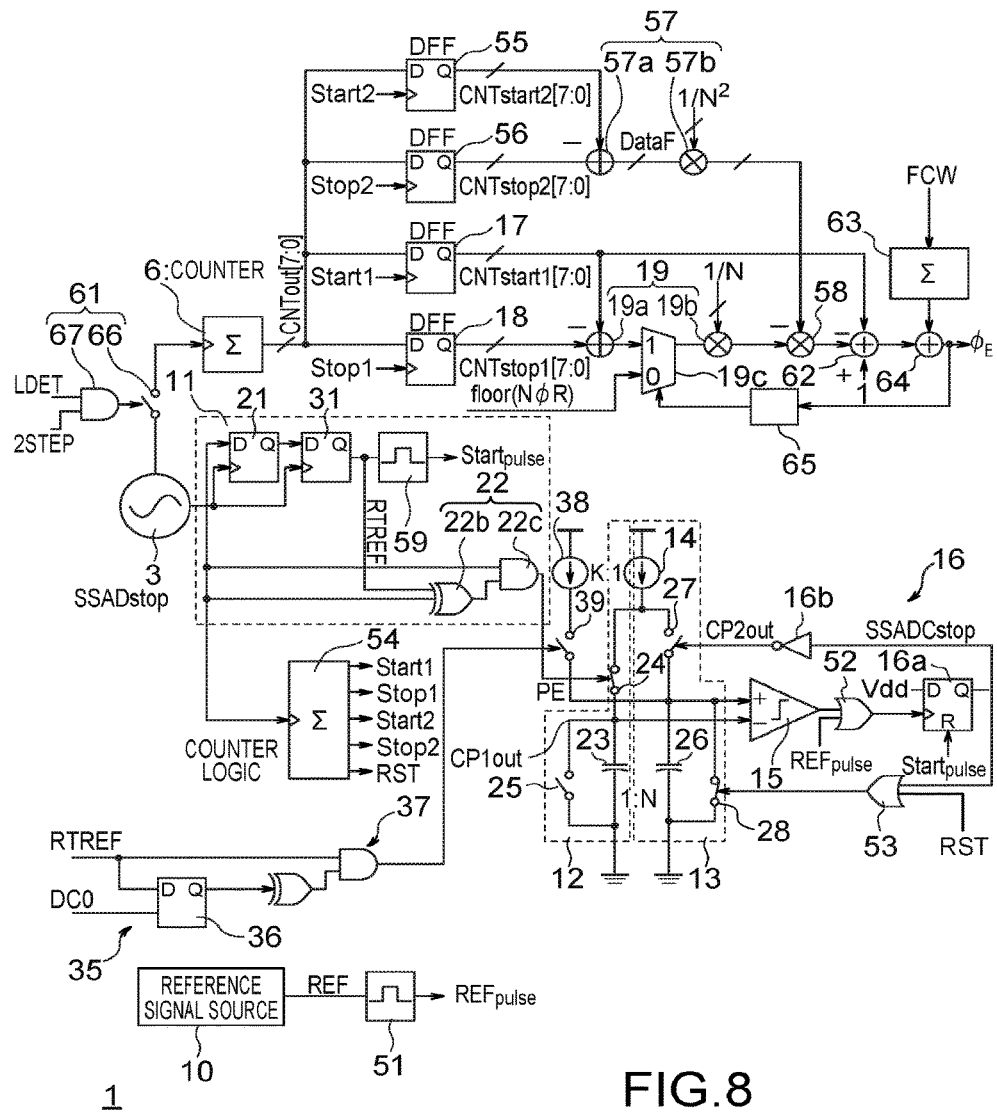
FIG. 8 is a block diagram showing an internal configuration of a TDC according to a fifth embodiment.

FIG. 8 is a block diagram showing an internal configuration of a TDC 1 according to the fifth embodiment. The TDC 1 in FIG. 8 includes a precharge signal generator 35 added to the TDC 1 of FIG. 7. The precharge signal generator 35 generates a precharge signal having a pulse width corresponding to time necessary for passing a reference signal REF through an m-staged DFF 31.

The precharge signal generator 35 in FIG. 8 has an m-staged DFF (third synchronizing circuitry) 36 coupled in series, and a second logic and arithmetic unit 37. The m-staged DFF 36 includes the same number of DFFs as the number of stages in the m-staged DFF 31 in a phase difference detector 11, the DFFs being coupled in series. In FIG. 8, the following expression is satisfied: m=1, but m may be at least two. The number of stages m in the DFF 36 is the same as the number of stages m in the DFF 31 in the phase difference detector 11.

The m-staged DFF 36 synchronizes (latches) an output signal of a DFF 21 or an output signal of a DFF at a prior stage in the phase difference detector 11, with an oscillation signal of a DCO 3. Accordingly, a DFF at a last stage in the m-staged DFF 36 outputs a signal RTREF2 having a phase delayed by the oscillation cycle of the DCO 3 multiplied by m, with respect to a phase difference signal PE. In FIG. 8, the following expression is satisfied: m=1 so that the signal RTREF2 is a signal delayed by one cycle of the oscillation signal of the DCO 3 (2n), with respect to the phase difference signal PE.

The second logic and arithmetic unit 37 in the precharge signal generator 35 generates a pulse signal PC having a pulse width from the falling edge of the phase difference signal PE to the rising edge of the signal RTREF2. A signal including the signal RTREF2 delayed by an even-staged inverter, is a signal START.

The TDC 1 in FIG. 8 includes a second current source 38 and a fifth switch 39. The fifth switch 39 is turned on or off with the pulse signal PC generated by the precharge signal generator 35. More specifically, when the pulse signal PC is turned on, the fifth switch 39 is turned on. When the pulse signal PC is turned off, the fifth switch 39 is turned off.

When the fifth switch 39 is turned on, a current flows from the second current source 38 to a second capacitor 26 in the second charge pump 13. Therefore, a preliminary charge, namely, a precharge of the second capacitor 26 is performed during a period during which the pulse signal PC is high.

When the preliminary charge of the second capacitor 26 is completed, the signal START is turned high and a Q output signal of a DFF 16a in a charge and discharge controller 16 is turned low. Then, a third switch 27 is turned on and a fourth switch 28 is turned off so that the second capacitor 26 is charged in the second charge pump 13.

The ratio of a current flowing from a first current source 14 and the current flowing from the second current source 38 is 1: K (1<K<N). For example, when the following expression is satisfied: K≥N, the charge voltage CP2out of the second capacitor 26 reaches a voltage equal to or more than the charge voltage CP1out of a first capacitor 23 during the period of the preliminary charge. Thus, A/D conversion is not appropriately performed and K≥N is unfavorable. When the following expression is satisfied: K≤1, time necessary for completing the comparative operation of a comparator 15 further lengthens in comparison to a case where the precharge signal generator 35 is not provided, so that K≤1 is also unfavorable.

In this manner, according to the fifth embodiment, even when the pules width of the phase difference signal PE increases by providing the m-staged DFF 31 in the phase difference detector 11, the precharge signal generator 35 preliminarily charges the second capacitor 26, in an amount of the increase of the pulse width of the phase difference signal PE. Thus, it is possible to shorten the time necessary for the comparative operation of the comparator 15 so that the phase difference between the oscillation signal of the DCO 3 and the reference signal REF can be promptly and accurately detected.

Sixth Embodiment

Figure 9:
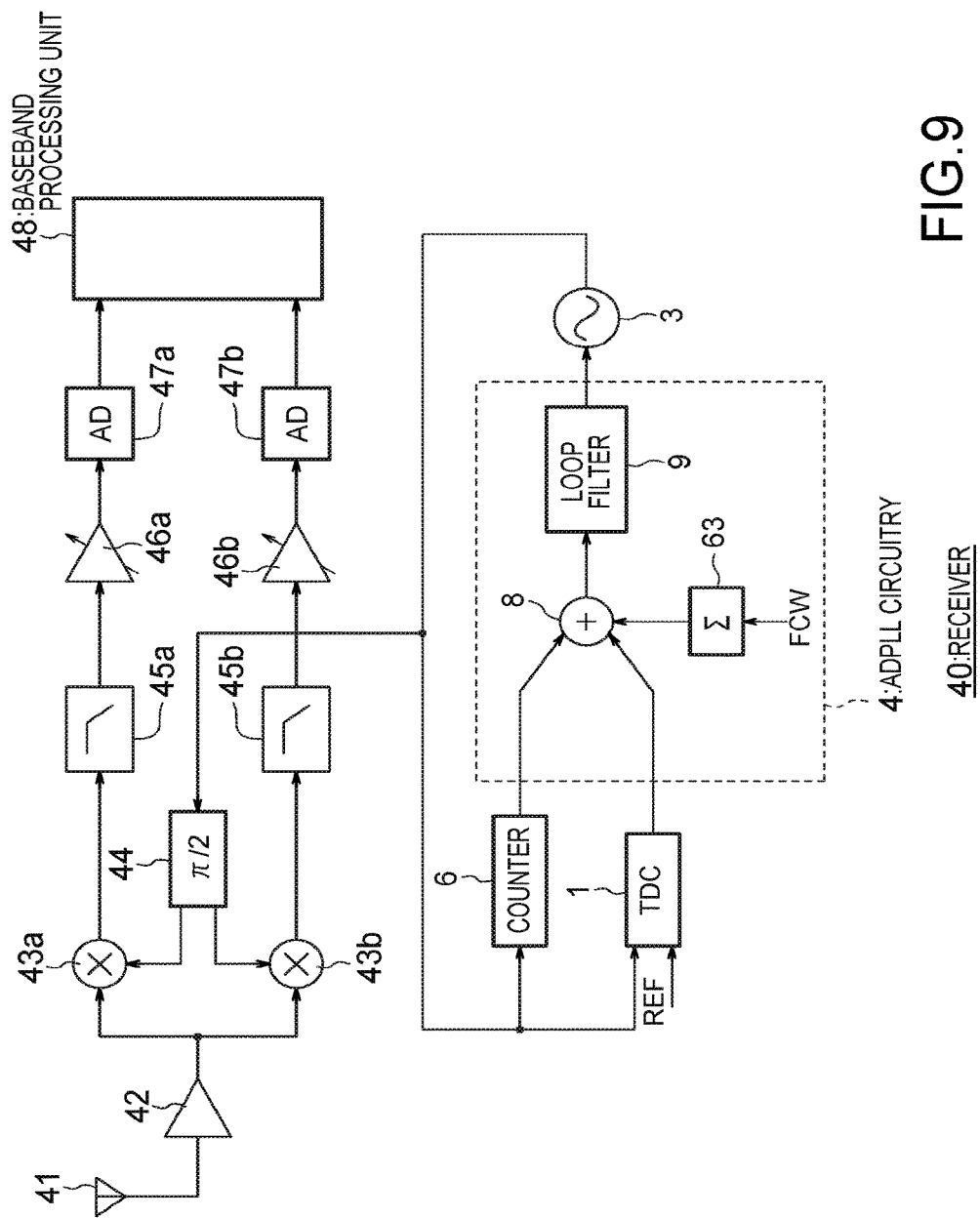
FIG. 9 is a block diagram showing an internal configuration of a receiver having any of the TDCs according to the first to fifth embodiments.

Each of the TDCs 1 according to the first to fifth embodiments can be used for a receiver. FIG. 9 is a block diagram showing an internal configuration of the receiver 40 having any one of the TDCs 1 according to the first to fifth embodiments.

The receiver 40 in FIG. 9 has an antenna 41, a local oscillator 2 having a configuration similar to that in FIG. 2, a high-frequency amplifier 42, quadrature demodulators 43a and 43b, a 90° phase shifter 44, low pass filters 45a and 45b, variable gain amplifiers (VGAs) 46a and 46b, A/D converters 47a and 47b, and a baseband processing unit 48.

The quadrature demodulators 43a and 43b generate an I signal and a Q signal out of phase with each other by 90°, respectively, based on a local oscillation signal output from the local oscillator 2 and a signal including the local oscillation signal shifted by a phase of 90° by the 90° phase shifter 44. The low pass filters 45a and 45b remove harmonic noise included in the I signal and the Q signal, respectively. The variable gain amplifiers 46a and 46b adjust the gain of the I signal and the gain of the Q signal after the removal of the noise, respectively. The A/D converters 47a and 47b convert the I signal and the Q signal output from the variable gain amplifiers 46a and 46b into digital data and input the digital data to the baseband processing unit 48, respectively.

The receiver 40 can be used as a single body or can be used as a radio communication device including a transmitter.

Figure 10:
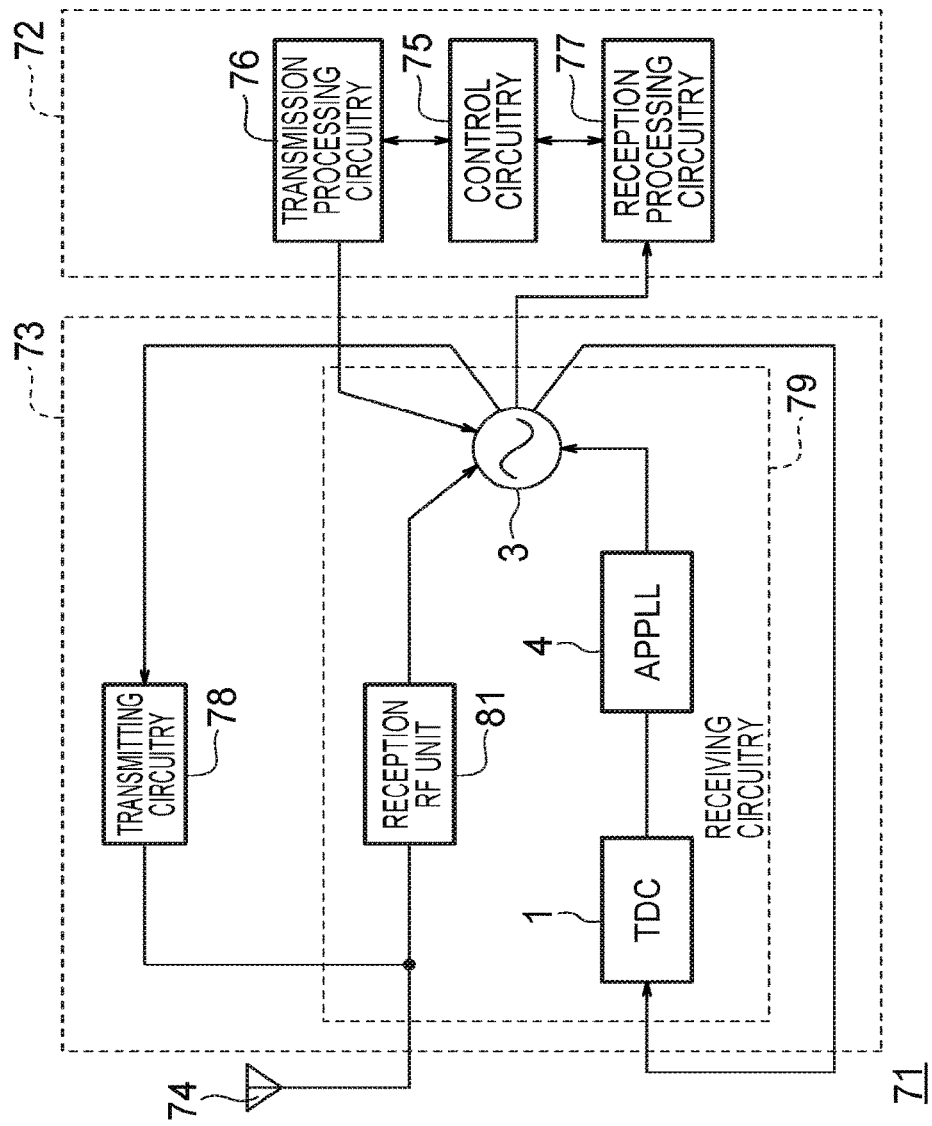
FIG. 10 is a block diagram showing a schematic configuration of a radio communication device according to a sixth embodiment.

FIG. 10 is a block diagram showing a schematic configuration of the radio communication device 71 according to a sixth embodiment.

The radio communication device 71 in FIG. 10 includes a baseband processing unit 72, an RF unit 73, and an antenna unit 74.

The baseband processing unit 72 has control circuitry 75, transmission processing circuitry 76, and reception processing circuitry 77. Each of the circuitries in the baseband processing unit 72 performs digital signal processing.

The control circuitry 75 performs, for example, processing of a media access control (MAC) layer. The control circuitry 75 may perform processing of a host network hierarchy of the MAC layer. The control circuitry 75 may perform processing relating to multi-input multi-output (MIMO). The control circuitry 75 may perform, for example, propagation path estimation processing, transmission weight calculation processing, and stream separation processing.

The transmission processing circuitry 76 generates a digital transmission signal. The reception processing circuitry 77 performs processing of analyzing a preamble and a physical header, for example, after performing demodulation and decoding.

The RF unit 73 includes a transmitting circuitry 78 and a receiving circuitry 79. The transmitting circuitry 78 includes a transmission filter not illustrated that extracts a signal in a transmission band, a mixer not illustrated that upconverts the signal that has passed through the transmission filter, into a radio frequency by using an oscillation signal of a DCO 3, and a preamplifier not illustrated that amplifies the signal that has been upconverted. The receiving circuitry 79 has a configuration similar to that of the receiver 40 of FIG. 9 described above. That is, the receiving circuitry 79 has a TDC 1, ADPLL circuitry 4, a reception RF unit 81, and the DCO 3. The transmitting circuitry 78 and the receiving circuitry 79 in FIG. 10 share the DCO 3, but a separate DCO 3 may be provided for each of the circuitries.

When the antenna unit 74 transmits and receives a radio signal, a switch for coupling any one of the transmitting circuitry 78 and the receiving circuitry 79 to the antenna unit 74, may be provided in the RF unit 73. When this type of switch is provided, the antenna unit 74 can be coupled to the transmitting circuitry 78 during the transmission, and the antenna unit 74 can be coupled to the receiving circuitry 79 during the reception.

Figure 11:
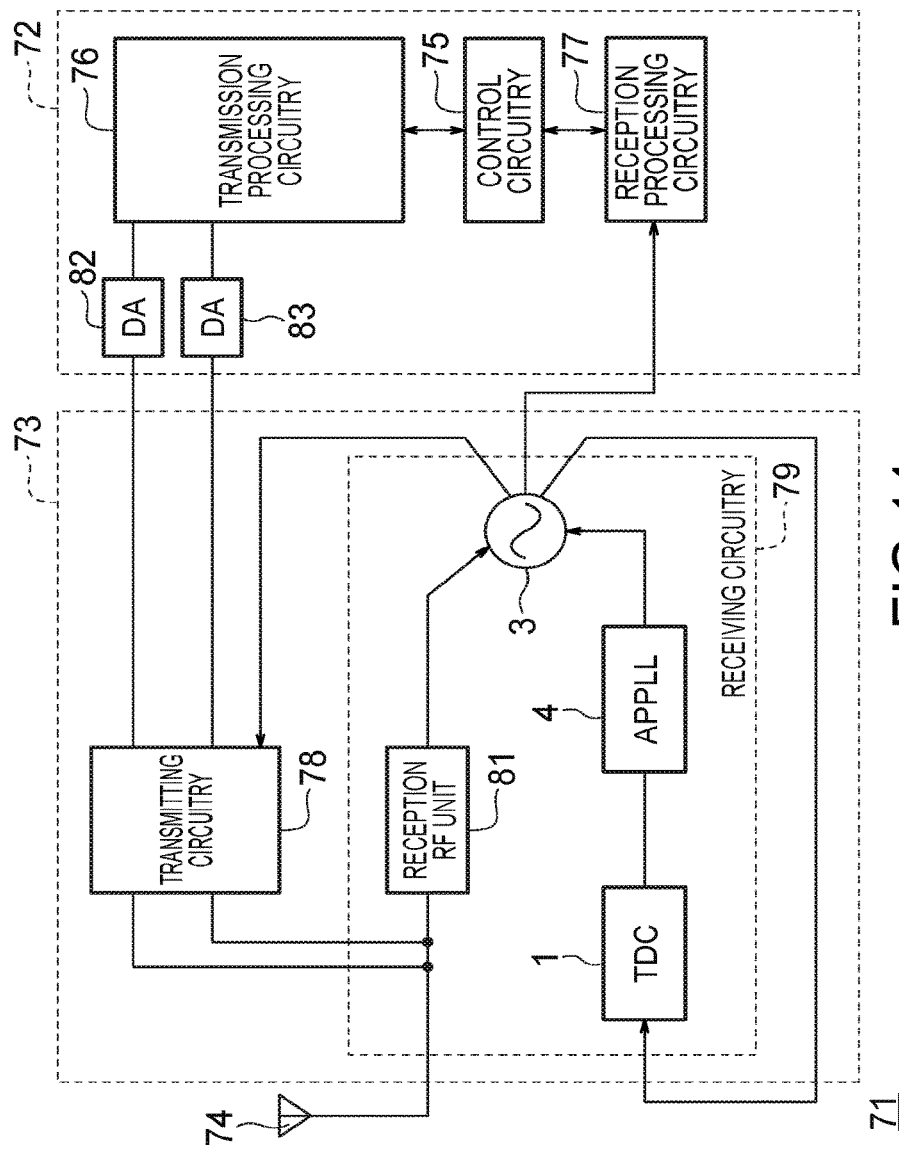
FIG. 11 is a block diagram showing another configuration of the radio communication device.

The transmission processing circuitry 76 in FIG. 10 outputs only a single-channel transmission signal, but may separately output an I signal and a Q signal in accordance with a radio system. A block diagram of another configuration of the radio communication device 71 in this case is, for example, illustrated in FIG. 11. The radio communication device 71 in FIG. 11 is different from that in FIG. 10 in terms of the configuration between transmission processing circuitry 76 and transmitting circuitry 78.

The transmission processing circuitry 76 generates a double-channel digital baseband signal (hereinafter, referred to as a digital I signal and a digital Q signal).

DA conversion circuitry 82 that converts the digital I signal into an analog I signal, and DA conversion circuitry 83 that converts the digital Q signal into an analog Q signal, are provided between the transmission processing circuitry 76 and the transmitting circuitry 78. The transmitting circuitry 78 upconverts the analog I signal and the analog Q signal by using a mixer not illustrated.

A reception RF unit 81 has, for example, the local oscillator 2, the high-frequency amplifier 42, the quadrature demodulators 43a and 43b, the 90° phase shifter 44, the low pass filters 45a and 45b, the variable gain amplifiers (VGAs) 46a and 46b, the A/D converters 47a and 47b, and the baseband processing unit 48 in FIG. 9.

The RF unit 73 and the baseband processing unit 72 illustrated in each of FIGS. 10 and 11 may be made on one chip, or the RF unit 73 and the baseband processing unit 72 may be individually made on a separate chip. The RF unit 73 and the baseband processing unit 72 may partially include a discrete component, and the remaining may include one or a plurality of chips.

Furthermore, the RF unit 73 and the baseband processing unit 72 may include a software radio reconfigurable with software. In this case, a digital signal processing processor is used so that functions of the RF unit 73 and the baseband processing unit 72 are at least achieved with the software. In this case, a bus, the processor, and an external interface unit are provided inside the radio communication device 71 illustrated in each of FIGS. 10 and 11. The processor and the external interface unit are coupled through the bus, and firmware operates in the processor. The firmware can be updated with a computer program. The processor operates the firmware so that processing operations of the RF unit 73 and the baseband processing unit 72 illustrated in each of FIGS. 10 and 11 can be performed in the processor.

The radio communication devices 71 illustrated in FIGS. 10 and 11 include only the single antenna unit 74, but the number of the antennas is not particularly limited. For example, a transmission antenna unit 74 and a reception antenna unit 74 may be separately provided or an I signal antenna unit 74 and a Q signal antenna unit 74 may be separately provided. When only one antenna unit 74 is provided, a transmission-and-reception changeover switch at least makes a switch of the transmission and the reception.

The radio communication devices 71 illustrated in FIGS. 10 and 11 can be applied to a stationary radio communication device 71, such as an access point, a wireless router, or a computer, can be applied to a portable radio terminal, such as a smartphone or a mobile phone, can be applied to peripheral equipment, such as a mouse or a keyboard, that performs radio communication with a host device, can be applied to a card-typed member including a radio function built therein, or can be applied to a wearable terminal that performs radio communication of biological information. Various examples of a radio system of the radio communication between the radio communication devices 71 illustrated in FIG. 10 or 11, that can be applied, include, but are not particularly limited to, third generation or later cellular communication, a wireless LAN, Bluetooth (registered trademark), and near-field radio communication.

Figure 12:
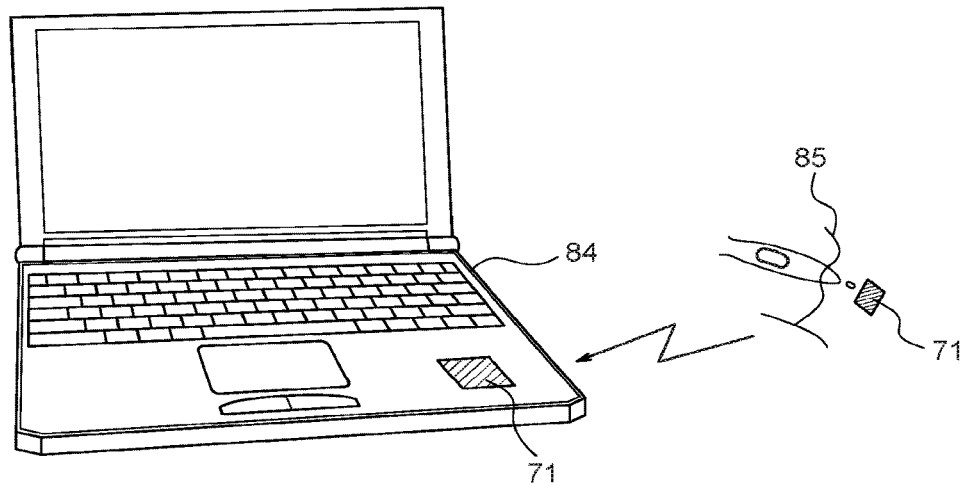
FIG. 12 is a view of exemplary radio communication between a PC and a mouse.

FIG. 12 illustrates exemplary performance of radio communication between a PC 84 being a host device and a mouse 85 being peripheral equipment. Both the PC 84 and the mouse 85 include the radio communication device 71 illustrated in FIG. 10 or 11 built therein. The mouse 85 uses power of a built-in battery to perform the radio communication, and is required to perform the radio communication with power consumption as low as possible because a space in which the battery is built is limited.

Accordingly, using a radio system capable of low consumption radio communication, such as Bluetooth Low Energy decided in a standard of Bluetooth (registered trademark) 4.0, preferably performs the radio communication.

Figure 13:
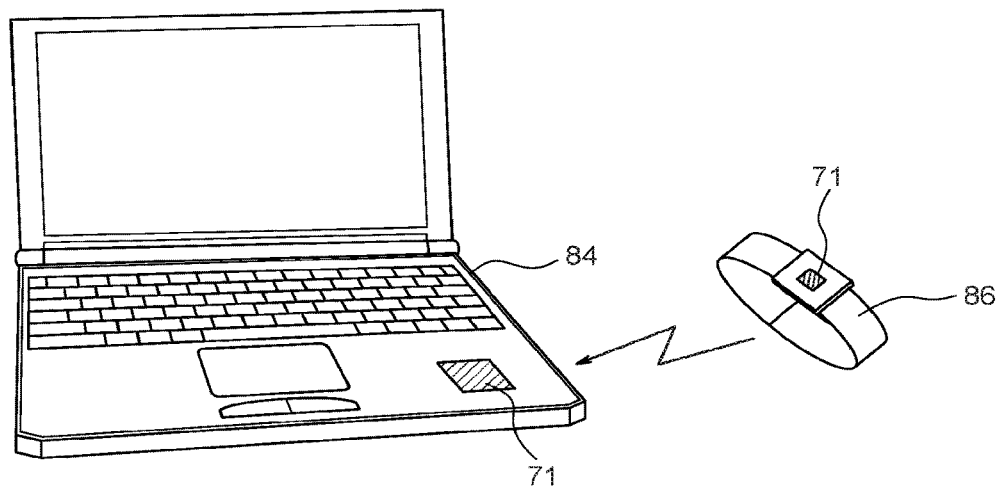
FIG. 13 is a view of exemplary radio communication between a wearable terminal and a host device.

FIG. 13 illustrates exemplary performance of radio communication between a wearable terminal 86 and a host device (for example, the PC 84). The wearable terminal 86 is to be worn on a body of a person, and various examples thereof may include a seal type to be worn on a body, an eyeglasses type and an earphone type to be worn on a body except arms, and a pacemaker to be inserted inside a body, in addition to a type to be worn on an arm illustrated in FIG. 13. Both the wearable terminal 86 and the PC 84 in FIG. 13 also include the radio communication device 71 illustrated in FIG. 10 or 11 built therein. Note that, examples of the PC 84 include a computer and a server. The above radio system capable of the radio communication with low power consumption, such as Bluetooth Low Energy, is also preferably adopted because the wearable terminal 86 is worn on a body of a person and a space for a built-in battery is limited.

When the radio communication is performed between the radio communication devices 71 illustrated in FIG. 10 or 11, the type of information to be transmitted and received through the radio communication is not particularly limited. Note that, the radio system is preferably varied between a case where information including a large amount of data, such as moving image data, is transmitted and received and a case where information including a small amount of data, such as operation information of the mouse 85, is transmitted and received. Thus, there is a need to perform the radio communication in an optimum radio system in response to the amount of information to be transmitted and received.

Furthermore, when the radio communication is performed between the radio communication devices 71 illustrated in FIG. 10 or 11, a notifying unit that notifies a user of an operation state of the radio communication, may be provided. Specific examples of the notifying unit may include display of the operation state on a display device including LEDs, notification of the operation state due to the vibration of a vibrator, and notification of the operation state from audio information due to a speaker or a buzzer.

The TDCs 1 and the receiver 40 described in the above embodiments, may at least partially include hardware or include software. When the configuration including the software is provided, a program for achieving the function of the at least partial TDCs 1 and receiver 40 may be stored in a storage medium, such as a flexible disk or a CD-ROM, and then may be read and performed by a computer. The storage medium is not limited to a detachably attachable storage medium, such as a magnetic disk or an optical disc, and may be a non-removable storage medium, such as a hard disk or a memory.

The program for achieving the function of the at least partial TDCs 1 and receiver 40, may be distributed through a communication line, such as the Internet, (including radio communication). Furthermore, the program that has been encrypted, modulated, or compressed, may be distributed through a wired line or a wireless line, such as the Internet, or may be stored in a storage medium and then may be distributed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A time to digital converter comprising:
   a counter to measure the number of cycles of a first signal;
   a first phase difference detector to generate a phase difference signal having a pulse width in accordance with a phase difference between the first signal and a second signal having a frequency twice or more as low as a frequency of the first signal;
   a first capacitor to be charged with an electric charge in accordance with the pulse width of the phase difference signal;
   a second capacitor having capacitance N times a capacitance of the first capacitor, the N being a real number larger than 1;
   a comparator to compare a charge voltage of the first capacitor with a charge voltage of the second capacitor;
   a first charge controller to continue to charge the second capacitor until the comparator detects that the charge voltage of the second capacitor is equal to or more than the charge voltage of the first capacitor;
   a first phase difference arithmetic unit to operate the phase difference between the first signal and the second signal, based on a value obtained by dividing a count value of the counter during a charge period of the second capacitor, by the N;
   a second phase difference detector to generate a phase difference signal having a pulse width in accordance with the phase difference between the first signal and the second signal when the first charge controller continues to charge the second capacitor and the comparator detects that the charge voltage of the second capacitor is equal to or more than the charge voltage of the first capacitor;
   a second charge controller to continue to charge the second capacitor until the comparator again detects that the charge voltage of the second capacitor is equal to or more than the charge voltage of the first capacitor after the first capacitor is charged based on the pulse width of the phase difference signal generated by the second phase difference detector;
   a second phase difference arithmetic unit to operate the phase difference between the first signal and the second signal, based on a value obtained by dividing the count value of the counter during the charge period of the second capacitor by the N squared; and
   a third phase difference arithmetic unit to detect a fractional phase difference between the first signal and the second signal, based on the phase difference operated by the first phase difference arithmetic unit and the phase difference operated by the second phase difference arithmetic unit,
   wherein the first phase difference arithmetic unit operates the phase difference between the first signal and the second signal, based on a reference phase, when the counter suspends a measurement operation.

2. The time to digital converter according to claim 1, further comprising:
   a counter operation selector to select any one of a first operation mode and a second operation mode, in the first operation mode, the counter performing the measurement operation while the first charge controller and the second charge controller continue to charge the second capacitor, in the second operation mode, the counter suspending the measurement operation while the first charge controller continues to charge the second capacitor and additionally the counter performing the measurement operation while the second charge controller continues to charge the second capacitor.

3. The time to digital converter according to claim 1, wherein the first phase difference arithmetic unit operates the phase difference between the first signal and the second signal, with an integral component of a value obtained by multiplying the reference phase by the N, when the counter suspends the measurement operation.

4. The time to digital converter according to claim 3, further comprising:
   a phase detector to detect a phase of the first signal, based on the count value of the counter and the fractional phase difference detected by the third phase difference arithmetic unit;

a phase error detector to detect a phase error, based on the phase of the first signal detected by the phase detector and the reference phase;
a lock detector to detect that the phase error is equal to or less than a predetermined threshold value; and
a counter switching controller to control whether the counter performs the measurement operation, based on a detection result of the lock detector.

5. The time to digital converter according to claim 4, wherein the counter switching controller controls the counter to start the measurement operation when the lock detector detects that the phase error is equal to or less than the threshold value and when the second charge controller starts charging the first capacitor.

6. The time to digital converter according to claim 1, further comprising:
an integrator to integrate a frequency command word to detect the reference phase.

7. The time to digital converter according to claim 1, further comprising:
a first current source to supply a charge current to the first capacitor and the second capacitor;
a first selector to switch whether the charge current is supplied from the first current source to the first capacitor, due to the phase difference signal; and
a second selector to switch whether the charge current is supplied from the first current source to the second capacitor, due to a signal from the first charge controller.

8. The time to digital converter according to claim 1, further comprising:
a discharge controller to discharge the first capacitor and the second capacitor when the comparator detects that the charge voltage of the second capacitor is equal to or more than the charge voltage of the first capacitor.

9. The time to digital converter according to claim 8, wherein the discharge controller comprises:
a third selector to make a short circuit between both electrodes of the first capacitor to discharge the first capacitor, based on a signal from the first charge controller; and
a fourth selector to make a short circuit between both electrodes of the second capacitor to discharge the second capacitor, based on the signal from the first charge controller.

10. The time to digital converter according to claim 1, wherein the first charge controller charges the first capacitor during time in accordance with the pulse width of the phase difference signal.

11. The time to digital converter according to claim 1, further comprising:
a first retaining unit to retain the count value of the counter when the charge of the second capacitor starts;
a second retaining unit to retain the count value of the counter when the comparator detects that the charge voltage of the second capacitor is equal to or more than the charge voltage of the first capacitor; and
a difference arithmetic unit to operate a count value of a difference between the count value of the second retaining unit and the count value of the first retaining unit,
wherein the first phase difference arithmetic unit operates the phase difference by dividing the count value operated by the difference arithmetic unit, by the N.

12. The time to digital converter according to claim 1, wherein the first phase difference detector comprises:
first synchronizing circuitry to synchronize the second signal at a rising edge or falling edge of the first signal;
second synchronizing circuitry including m stages coupled in series, the second synchronizing circuitry latching an output signal of the first synchronizing circuitry or an output signal at a prior stage, at a same edge of the first signal as the first synchronizing circuitry, the m being an integer of 1 or more; and
a first logic and arithmetic unit to generate the phase difference signal based on the output signal of the first synchronizing circuitry and an output signal of the second synchronizing circuitry.

13. The time to digital converter according to claim 12, further comprising:
a precharge signal generator to generate a precharge signal having a pulse width in accordance with time necessary for passing the second signal through the second synchronizing circuitry including the m stages; and
a charge reinforcing unit to reinforce a charge current to the second capacitor during a time in accordance with the pulse width of the precharge signal after the charge of the second capacitor starts.

14. The time to digital converter according to claim 13, wherein the precharge signal generator comprises:
a third synchronizing circuitry including the m stages, the third synchronizing circuitry to latch the output signal of the first synchronizing circuitry or the output signal at the prior stage, at a same edge of the first signal as the first synchronizing circuitry; and
a second logic and arithmetic unit to generate the precharge signal based on the output signal of the first synchronizing circuitry and an output signal of the third synchronizing circuitry.

15. The time to digital converter according to claim 13, further comprising:
a first current source to supply a charge current to the first capacitor and the second capacitor,
wherein the charge reinforcing unit comprises a second current source that supplies the charge current to the second capacitor, and
the charge current supplied from the second current source to the second capacitor is K times the charge current supplied from the first current source to the second capacitor, the K being a real number larger than 1 and smaller than the N.

16. The time to digital converter according to claim 1, further comprising:
an integrated circuitry which comprises the counter, the first phase difference detector, the first capacitor, the second capacitor, the comparator, the first charge controller, the first phase difference arithmetic unit, the second phase difference detector, the second charge controller, the second phase difference arithmetic unit, and the third phase difference arithmetic unit.

17. The time to digital converter according to claim 16, further comprising:
the integrated circuitry; and
at least one antenna.

18. A radio communication device comprising:
an RF unit; and
a baseband unit,
wherein the RF unit comprises transmitting circuitry and receiving circuitry,
the receiving circuitry comprises:
an oscillator to generate an oscillation signal in accordance with a phase difference;
a time to digital converter to detect the phase difference between the oscillation signal and a reference signal;

PLL circuitry to perform feed-back control of the oscillation signal so that the phase difference is canceled; and a reception RF unit to perform reception processing by using the oscillation signal, wherein the time to digital converter comprises:

a counter to measure the number of cycles of a first signal;

a first phase difference detector to generate a phase difference signal having a pulse width in accordance with a phase difference between the first signal and a second signal having a frequency twice or more as low as a frequency of the first signal;

a first capacitor to be charged with an electric charge in accordance with the pulse width of the phase difference signal;

a second capacitor having capacitance N times a capacitance of the first capacitor, the N being a real number larger than 1;

a comparator to compare a charge voltage of the first capacitor with a charge voltage of the second capacitor;

a first charge controller to continue to charge the second capacitor until the comparator detects that the charge voltage of the second capacitor is equal to or more than the charge voltage of the first capacitor;

a first phase difference arithmetic unit to operate the phase difference between the first signal and the second signal, based on a value obtained by dividing a count value of the counter during a charge period of the second capacitor, by the N;

a second phase difference detector to generate a phase difference signal having a pulse width in accordance with the phase difference between the first signal and the second signal when the first charge controller continues to charge the second capacitor and the comparator detects that the charge voltage of the second capacitor is equal to or more than the charge voltage of the first capacitor;

a second charge controller to continue to charge the second capacitor until the comparator again detects that the charge voltage of the second capacitor is equal to or more than the charge voltage of the first capacitor after the first capacitor is charged based on the pulse width of the phase difference signal generated by the second phase difference detector;

a second phase difference arithmetic unit to operate the phase difference between the first signal and the second signal, based on a value obtained by dividing the count value of the counter during the charge period of the second capacitor, by the N squared; and a third phase difference arithmetic unit to detect a fractional phase difference between the first signal and the second signal, based on the phase difference operated by the first phase difference arithmetic unit and the phase difference operated by the second phase difference arithmetic unit, wherein the first phase difference arithmetic unit operates the phase difference between the first signal and the second signal, based on a reference phase, when the counter suspends a measurement operation.

19. The radio communication device according to claim 18, further comprising:

a counter operation selector to select any one of a first operation mode and a second operation mode, in the first operation mode, the counter performing the measurement operation while the first charge controller and the second charge controller continue to charge the second capacitor, in the second operation mode, the counter suspending the measurement operation while the first charge controller continues to charge the second capacitor and additionally the counter performing the measurement operation while the second charge controller continues to charge the second capacitor.

20. A radio communication method comprising:

measuring the number of cycles of a first signal by a counter;

generating a phase difference signal having a pulse width in accordance with a phase difference between the first signal and a second signal having a frequency twice or more as low as a frequency of the first signal;

charging, into a first capacitor, an electric charge in accordance with the pulse width of the phase difference signal;

comparing a charge voltage of a second capacitor having capacitance N times a capacitance of the first capacitor, the N being a real number larger than 1, with a charge voltage of the first capacitor;

continuing to charge the second capacitor until the charge voltage of the second capacitor becomes equal to or more than the charge voltage of the first capacitor;

operating, by a first phase difference arithmetic unit, the phase difference between the first signal and the second signal, based on a value obtained by dividing a count value of the counter during a charge period of the second capacitor, by the N;

generating a phase difference signal having a pulse width in accordance with the phase difference between the first signal and the second signal when the second capacitor continues to be charged and it is detected that the charge voltage of the second capacitor is equal to or more than the charge voltage of the first capacitor;

continuing to charge the second capacitor until it is again detected that the charge voltage of the second capacitor is equal to or more than the charge voltage of the first capacitor after the first capacitor is charged based on the pulse width of the phase difference signal;

operating, by a second phase difference arithmetic unit, the phase difference between the first signal and the second signal, based on a value obtained by dividing the count value of the counter during the charge period of the second capacitor, by the N squared; and detecting a fractional phase difference between the first signal and the second signal, based on the phase difference operated by the first phase difference arithmetic unit and the phase difference operated by the second phase difference arithmetic unit, wherein the first phase difference arithmetic unit operates the phase difference between the first signal and the second signal, based on a reference phase, when the counter suspends a measurement operation.

* * * * *